United States Patent
Zwadlo et al.

(10) Patent No.: US 7,802,598 B2
(45) Date of Patent: Sep. 28, 2010

(54) LAMINATION DEVICE METHOD FOR FLEXOGRAPHIC PLATE MANUFACTURING

(75) Inventors: Gregory L. Zwadlo, River Falls, WI (US); Peter A. Stolt, Edina, MN (US); Christopher G. Staudt, Hampton, MN (US); Christopher M. Muir, Rochester, NY (US); Bradley S. Bush, Hilton, NY (US); Randy E. Armbruster, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 12/780,185

(22) Filed: May 14, 2010

(65) Prior Publication Data

US 2010/0218898 A1    Sep. 2, 2010

Related U.S. Application Data

(62) Division of application No. 11/770,374, filed on Jun. 28, 2007.

(51) Int. Cl.
*B32B 37/10* (2006.01)

(52) U.S. Cl. .............. 156/364; 156/362; 156/391; 156/584

(58) Field of Classification Search .......... 156/64, 156/247, 249, 285, 286, 344, 362, 364, 391, 156/584

See application file for complete search history.

(56) References Cited

U.S. PATENT DOCUMENTS

| 4,323,637 | A | 4/1982 | Chen et al. |
| 4,427,749 | A | 1/1984 | Graetzel et al. |
| 4,894,315 | A | 1/1990 | Feinberg et al. |
| 5,175,072 | A | 12/1992 | Martens |
| 5,279,697 | A | 1/1994 | Peterson et al. |
| 6,503,130 | B2 * | 1/2003 | Lim .................. 451/285 |
| 6,998,218 | B2 | 2/2006 | Markhart |
| 7,066,230 | B2 * | 6/2006 | Fishburn ............. 156/382 |
| 7,279,254 | B2 | 10/2007 | Zwadlo |
| 2004/0234886 | A1 | 11/2004 | Rudolph et al. |
| 2005/0227182 | A1 | 10/2005 | Ali et al. |
| 2006/0257780 | A1 | 11/2006 | Zwadlo |

FOREIGN PATENT DOCUMENTS

EP    1473153    11/2004

* cited by examiner

*Primary Examiner*—George R Koch, III
(74) *Attorney, Agent, or Firm*—Donna P. Suchy; J. Lanny Tucker

(57) ABSTRACT

A pre-press flexographic plate laminator for laminating a masking film onto a pre-press flexographic printing plate. The apparatus can be used to apply a balanced, non-distorting force to a flexographic printing plate and masking film with an optimized lamination force to achieve optical contact while minimizing lateral film distortion.

11 Claims, 12 Drawing Sheets

LAMINATION DEVICE METHOD FOR FLEXOGRAPHIC PLATE MANUFACTURING

CROSS-REFERENCE TO RELATED APPLICATIONS

This application is a divisional of U.S. patent application Ser. No. 11/770,374, filed Jun. 28, 2007, which is hereby incorporated herein by reference in its entirety.

FIELD OF THE INVENTION

This invention relates in general to a flexographic web manufacturing system and more specifically to an apparatus and method for laminating a masking film onto a pre-press flexographic printing plate to place the plate in optical contact with the film mask.

BACKGROUND OF THE INVENTION

The manufacturing of flexographic printing webs or flexographic printing plate precursors, that have photopolymerizable layers, for flexographic printing is a multi step process that produces a number of layers on a substrate in preparation for later steps that place images on the precursor. The flexographic printing plate precursors typically consist of a substrate suitable for flexographic printing with one or more photopolymerizable layers and optionally oxygen barrier layers. In the process a film or element in which a mask image can be formed that then can be used to form an imaged element bearing a relief image. These mask-forming films are readily useful for preparing flexographic printing plates, and to methods of making such plates.

Radiation-sensitive elements having a laser-ablatable mask layer on the surface are known in the art. A relief image can be produced in such elements without the use of a digital negative image or other imaged element or masking device. Films with a laser-ablatable mask layer can be formed by first imagewise exposing the film with laser radiation (generally an infrared radiation laser under computer control) to selectively remove the mask layer in the exposed areas. The masking film is then placed in contact with a radiation-sensitive element and subjected to overall exposure with actinic radiation (for example, UV radiation) to cure the radiation sensitive element in the unmasked areas and thus form a negative image of the mask in the element. The film containing the mask layer and the imaged radiation-sensitive element (such as an imaged printing plate precursor) are then subjected to solvent development. The unexposed printing plate areas and the mask layer are completely developed off, and after drying, the resulting imaged element is useful, for example as a flexographic printing plate.

While flexographic printing plates having an integral laser-ablatable mask layer allow direct imagewise exposure using a laser and do not require a separate masking device, the time for imaging is generally too long since the system sensitivity to imaging radiation is low. Various attempts have been made in the industry to overcome this problem by increasing the infrared sensitivity of the mask layer. However, obtaining higher sensitivity has been a challenge due to the widely varying quality criteria that must be simultaneously satisfied. In addition, this approach requires the use of high-powered laser-equipped imaging apparatus that is especially configured for imaging flexographic articles. Because of the need for varying the thickness of flexographic plates depending upon the specific intended uses, more than one imaging apparatus may be required for the integral-mask approach.

An important advance in the art of making and using masking films is described in a few publications owned by Eastman Kodak, including U.S. Patent Application Publication 2005/0227182 (Ali et al., hereinafter cited as US '182) which describes a method where a cover sheet is removed before exposure and Ser. No. 11/130,065 as well as application 93576 which discuss a method wherein the cover sheet is removed after exposure. The described methods provide various ways of making a mask image in significantly less time due to greater imaging sensitivity.

In a typical manufacturing line, the layers laid down on the substrate need to be protected during the process when the layers are tacky, for example during lamination or undesirable properties such as delays, non-uniformity and even unusable flexographic printing plate precursors will result.

These problems may be overcome by use of a specially designed apparatus and related method for laminating a masking film onto a pre-press flexographic printing plate to place the plate in optical contact by applying a balanced, non-distorting force to the flexographic printing plate and masking film.

SUMMARY OF THE INVENTION

This invention is directed to invention relates in general to a flexographic plate system and more specifically to an apparatus and method for an apparatus and related method for laminating a masking film onto a pre-press flexographic printing plate to place the plate in optical contact by applying a balanced, non-distorting force to the flexographic printing plate and masking film. This method includes laminating the pre-press flexographic printing plate with the film mask by applying an optimized lamination force to achieve optical contact while minimizing lateral film distortion.

DETAILED DESCRIPTION OF THE INVENTION

Definitions

Figure 1:
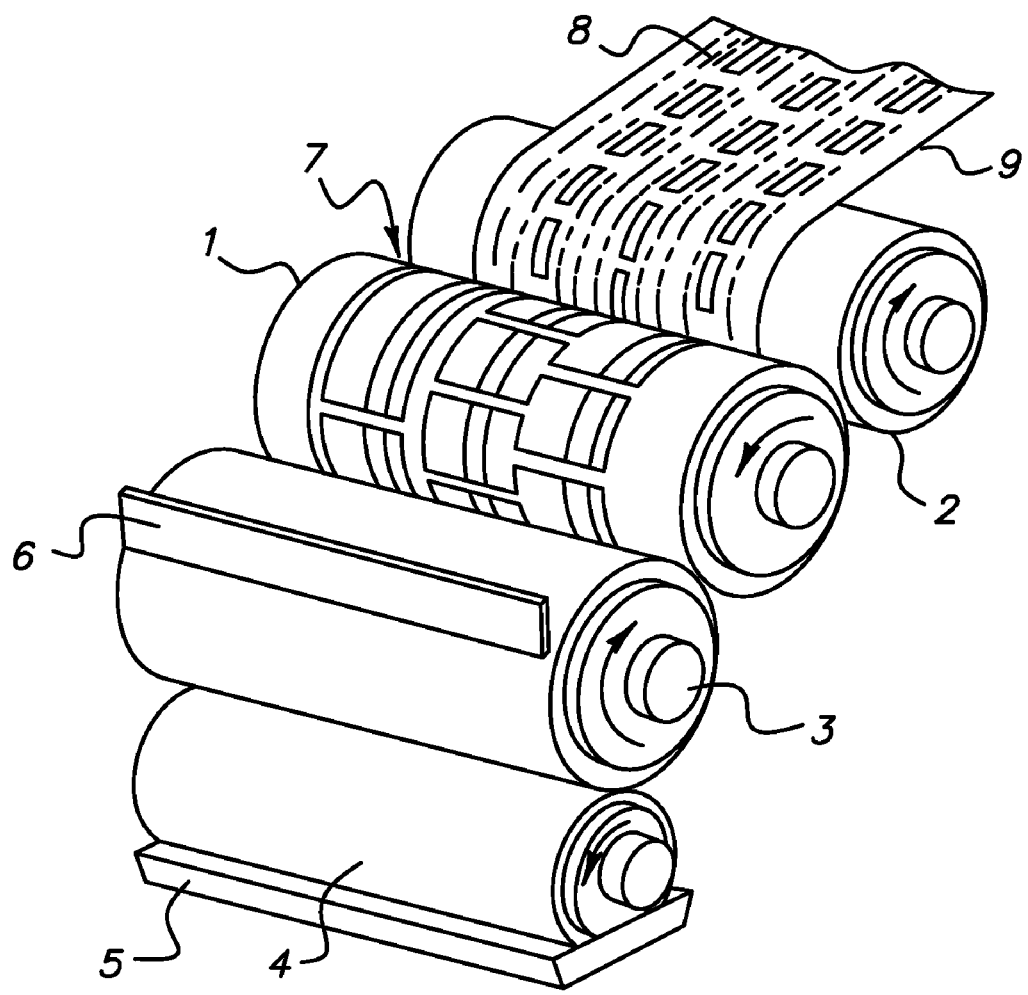
FIG. 1 is a schematic drawing of flexographic printing, in which the method of the present invention may be implemented.

Unless otherwise indicated, the "film" described herein is an embodiment of the present invention. The film may also be known as a "mask element", "mask film", or "masking element". Upon imaging, the film may be known as a "mask", "imaged film", or "imaged masking film" and contains a "mask image". Unless otherwise indicated, percentages are by weight.

The term "radiation-sensitive element" used herein includes any imageable element or material in which a relief image can be produced by exposure through the imaged masking film. Examples of radiation-sensitive elements include, but are not limited, to flexographic printing plate precursors, printed circuit boards, and flexographic printing plate precursors.

By "ablative", we mean that the imageable layer of the film can be imaged using a thermal ablating means such as laser radiation that causes rapid local changes in the imageable layer thereby causing the material(s) in the imageable layer to be ejected from the layer. This is distinguishable from other material transfer or imaging techniques in that a chemical change rather than a physical change (for example, melting, evaporation, or sublimation) is the predominant mechanism of imaging.

By "optical contact" we mean that two layers or two surfaces (as in the case of the imaged masking film and a radiation-sensitive element on a photopolymer or flexograghic printing plate), thus providing an "air-free interface". More precisely, two surfaces are defined as being in optical contact when the reflection and transmission characteristics of their interface are essentially fully described by the Fresnel laws for the reflection and transmission of light at the refractive-index boundary.

Film:

The film of this invention is used to form a mask image used eventually to form a relief image. The film may include one or more layers including one or more of a barrier layer, intermediate or intermediate layer, adhesive layer, or other layers generally used in the art in masking films according to US '182 noted above. Different constructions of the film may be used in one or more different imaging methods.

Carrier Sheet:

The carrier sheet, which is part of the mask, may be any suitable transparent substrate. Useful carrier sheets include but not limited to, transparent polymeric films and sheets such as polyesters including poly(ethylene terephthalate), poly(ethylene naphthalate), and fluorine polyester polymers, polyethylene, polypropylene, polybutadienes, polycarbonates, polyacrylates, polyvinyl chloride and copolymers thereof, and hydrolyzed and non-hydrolyzed cellulose acetate. Generally, the carrier sheet is from about 20 to about 200 μm thick. For example, a transparent poly(ethylene terephtalate) sheet sold under the name of MELINEX by DuPont Teijin Films (Hopewell, Va.) is suitable for this purpose.

If necessary, the carrier sheet surface can be treated to modify its wettability and adhesion to applied coatings. Such surface treatments include but are not limited to corona discharge treatment and the application of subbing layers. In addition, the carrier sheet can contain one or more "adhesion promoters" that improve adhesion between the carrier sheet and the next adjacent layer, whatever type of layer or whatever purpose that layer may have. Useful adhesion promoters include but are not limited to, gelatin, polyvinylidene chloride, poly (acrylonitrile-co-vinylidene chloride-co-acrylic acid), and polyethylenimine.

Transparent Layer:

The optional transparent layer is generally comprised of one or more film-forming polymeric materials that collectively provide a refractive index that is lower than the refractive index of the carrier sheet (or any optional immediately adjacent layer between the transparent layer and the carrier sheet). This difference in refractive index may be as low as 0.04 and more typically at least 0.08. One skilled in the art can readily determine useful polymeric film-forming materials since there are hundreds of possible materials commercially available. To see if a given material is useful, its refractive index (if not already known from the art or trade literature), can be determined by, for example, precisely measuring the location of the interference maxima in the spectral scan of a thin, uniform film of the material over the required range of wavelengths. This refractive index can then be compared to that of the carrier sheet (or optional intermediate layer) whose refractive index is known in the art or can be determined using a known procedure such as that just described.

Imageable Layer(s):

The imageable layer(s) are generally disposed on the transparent layer as relatively uniform coatings (that is, being substantially continuous and having fairly uniform thickness). In some embodiments, the imageable layer and transparent layer underneath it are the only layers on the carrier sheet. In other embodiments, there are multiple layers including multiple imaging layers or an imageable layer with a barrier layer, intermediate, or other layer(s) as described below.

The components of the imageable layer(s) are chosen to be soluble or swellable in suitable flexographic printing plate developers including both chlorinated organic solvents and the non-chlorinated organic solvents described below that are used to create the relief image after exposure of the radiation-sensitive element to curable radiation through the imaged masking film.

The imageable layer(s) generally includes one or more "colorants" or substances that may or may not impart visible color based on total solids of the layer. The colorant is generally capable of strong absorbance of the curing radiation or is otherwise capable of blocking curing radiation.

As used herein, "colorant" indicates a component that substantially prevents the transmission of curing radiation through the mask image. The colorant may be one or more dyes or pigments, or mixtures thereof that will provide desired spectral properties. It can be a particulate material that is dispersed within the polymeric binder(s) described below. For example, they can be black dyes or pigments such as carbon black, metal oxides, and other materials described for example in US '182 (noted above), that is incorporated herein in its entirety. It is useful that the pigments or dyes be substantially non-IR absorbing so that imaging of the radiation-sensitive element is not adversely affected. For example, the colorant can absorb UV or visible radiation, and in many embodiments, the colorant is an UV-absorbing dye.

Radiation-Sensitive Elements

Considerable details of useful radiation-sensitive elements such as flexographic printing plate precursors, printed circuit boards, and flexographic printing plates are provided in US '182 (noted above). Such elements include a suitable dimensionally stable substrate, at least one radiation-sensitive layer, and optionally a separation layer, cover sheet, or metal layer.

Suitable substrates include dimensionally stable polymeric films and aluminum sheets. Polyester films are preferred. Any radiation-sensitive element that is capable of producing a relief image using the film described herein is useful in the practice of this invention.

The radiation-sensitive element can be positive- or negative-working, but typically, it is negative-working and generally includes a visible- or UV-sensitive imageable layer containing a visible-radiation or UV-radiation curable composition that is cured or hardened by polymerization or crosslinking upon exposure to the curing radiation. For example, the radiation-sensitive element can be UV-sensitive. Many details of various components of the radiation-sensitive elements are provided in US '182 (noted above), and references cited therein.

Some embodiments also include a removable cover sheet. The cover sheet protects the radiation-sensitive imageable layer from fingerprints and other damage and that is disposed between the radiation-sensitive imageable layer and the cover sheet so that the plate does not result in imperfections or errors that may slow down or even shut down a flexographic printing system, as shown in FIG. 1. The system shown includes a plate cylinder 1, impression cylinder 2, anilox and fountain roller 3 and 4, ink pan 5, and doctor blade 6. The plate cylinder 1 is shown supporting a flexographic plate 7 being used to print images 8 on receivers 9.

The radiation-sensitive imageable layer can include an elastomeric binder, at least one monomer, and an initiator that is sensitive to non-IR radiation. In most cases, the initiator will be sensitive to UV or visible radiation. Suitable initiator compositions include but are not limited to those described in U.S. Pat. Nos. 4,323,637 (Chen et al.), 4,427,749 (Gruetzmacher et al.), and 4,894,315 (Feinberg et al.).

The elastomeric binder can be a single or mixture of polymers that may be soluble, swellable, or dispersible in aqueous, semi-aqueous, or organic solvent developers and include but are not limited to, binders that are soluble, swellable, or dispersible in organic solvents such as natural or synthetic polymers of conjugated diolefins, block copolymers, core-shell microgels, and blends of microgels and preformed macromolecular polymers. The elastomeric binder can comprise at least 65% of the imageable layer based on total layer solids. More details of such elastomeric binders are provided in [0190] of US '182 (noted above) and references cited therein.

The imageable layer can also include a single monomer or mixture of monomers that must be compatible with the elastomeric binder to the extent that a clear, non-cloudy radiation-sensitive layer is produced. Monomers for this purpose are well known the art and include ethylenically unsaturated polymerizable compounds having relatively low molecular weight (generally less than 30,000 Daltons). Examples of suitable monomers include various mono- and polyacrylates, acrylate derivatives of isocyanates, esters, and epoxides. Specific monomers are described in [0191] of US '182 (noted above) and in references cited therein.

The photoinitiator may be a single compound or combination of compounds that are sensitive to visible or UV radiation and that generate free radicals that initiate the polymerization of the monomer(s) without excessive termination and are generally present in an amount of from about 0.001 to about 10% based on the total dry weight of the imageable layer. Examples of suitable initiators include substituted or unsubstituted polynuclear quinines and further details are provided in [0192] of US '182 (noted above) and in references cited therein.

The radiation-sensitive layer can include other addenda that provide various properties including but not limited to sensitizers, plasticizers, rheology modifiers, thermal polymerization inhibitors, tackifiers, colorants, antioxidants, antiozonants, and fillers.

The thickness of the radiation-sensitive imageable layer may vary depending upon the type of imaged plate desired. In some embodiments, a UV-sensitive imageable layer may be from about 500 to about 6400 μm in thickness.

Forming a Mask Image:

In the practice of this invention, producing exposed and non-exposed regions in the film of this invention forms a mask image. The choice of imaging mechanism will determine the possible variations in forming the mask image, as described below.

Exposing the film can be carried out in selected regions, otherwise known as "imagewise exposure". Both analog and digital methods can be used for imagewise exposure and are conventional in the art. In some embodiments, imagewise exposure can be accomplished using laser radiation from a laser that is scanned or rasterized under computer control. Any of the known scanning devices can be used including flat-bed scanners, external drum scanners, and internal drum scanners. In these devices, the film is secured to the drum or bed, and the laser beam is focused to a spot that can impinge on the film. Two or more lasers may scan different regions of the film simultaneously.

For example, the film can be exposed to infrared radiation, for example, in the range of from about 700 to about 1400 nm. Such films contain one or more infrared radiation absorbing compounds as described above to provide sensitivity to infrared radiation. In these embodiments, the film may be suitably mounted to an infrared imager and exposed to the infrared radiation using an infrared laser such as a diode laser or Nd:YAG laser that may be scanned under computer control. Suitable infrared imagers include but are not limited to DESERTCAT 88 imagers available from ECRM (Tewksbury, Mass.) used in color proofing, TRENDSETTER imagesetters and ThermoFlex Flexographic CTP imagers available from Eastman Kodak Company (Burnaby, British Columbia, Canada) used for CTP flexographic plate applications and for imaging flexographic elements, DIMENSION imagesetters available from Presstek (Hudson, N.H.) useful for CTP flexographic plate applications, CYREL® Digital Imager (CDI SPARK) available from Esko-Graphics (Kennesaw, Ga.), and OMNISETTER imagers available from Misomex International (Hudson, N.H.) useful for imaging flexographic elements.

In other embodiments, the film is exposed to visible laser light, for example in the range of from about 400 to about 750 nm. Commercially available filmsetters and imagesetters can be used including but not limited to, ACCUSET Plus imagesetter (visible red laser diode, 670 nm) and ADVANTAGE DL3850 imagesetter (410 nm), SELECTSET 5000 imagesetter (HeNe, 630 nm), all available from Agfa-Gevaert (Belgium), LUXEL V-9600 (410 nm) available from Fuji Photo Film (Japan), and DIAMONDSETTER imagesetter (frequency-doubled Nd-YAG laser, 532 nm) available from Western Lithotech (St. Louis, Mo.).

In still other embodiments, the film can be exposed to ultraviolet radiation by laser direct imaging in the range of from about 150 to about 410 nm. Apparatus useful for such imaging include but are not limited to, DP-100 imagers available from Orbotech (Billerica, Mass.) and DIGIRITE 2000 imager available from Etec Systems (Tucson, Ariz.).

The step of forming the mask image may also include a step of removing either exposed or non-exposed regions of imageable layer. In some embodiments, the exposed regions are removed, leaving a mask image on the transparent carrier sheet (and transparent layer disposed thereon). For these embodiments, a receptor sheet may optionally be used for removal of unwanted portions of the imageable layer. Such a receptor sheet may be any suitable paper, transparent film, or metal sheet to which one or more coatings have been applied before irradiation of the films to facilitate transfer of the imageable layer to the receptor. After imaging, the receptor sheet may be removed from the film to reveal the mask image on the carrier sheet. A complementary image to the mask image may remain on the receptor sheet.

In other embodiments, a mask image is formed on the carrier sheet (and transparent layer disposed thereon) by producing exposed and non-exposed regions of the imageable layer and other layers, and removing non-exposed regions of those layers.

In some embodiments, the mask image residing on the carrier sheet may be cured by subjecting it to heat treatment, provided that the transfer property of the mask image is not adversely affected. Heat treatment may be done by a variety of means including but not limited to, storage in an oven, hot air treatment, or contact with a heated platen or passage through a heated roller device. Heat treatment is not necessary for curing to take place.

In still other embodiments, a mask image can be formed as noted above and the exposed regions are transferred to a receptor sheet. The receptor sheet it then removed from the imaged masking film before the mask image is transferred to a radiation-sensitive element. Thus, the film may be provided with a receptor sheet in contact with the radiation-sensitive element, or the element is contacted with a separate receptor sheet.

Where a separate receptor sheet is used during imaging, the film and receptor sheet are assembled in close proximity prior to imaging, with the image-receiving side of the receptor sheet adjacent to the imageable layer. The term "close proximity" in this context can mean that the imageable layer and receptor sheet are brought into contact, or that they do not contact each other but are sufficiently close to allow transfer of imageable layer or colorant upon exposure to imaging radiation. Vacuum hold-down or a mechanical means may be used to secure the film and receptor sheet in assembly.

Next, the assembly of the film and receptor sheets is imagewise exposed using imaging radiation to form a mask image, as described below.

Imagewise exposure causes imagewise transfer of imageable layer or colorant from the film to the receptor sheet. After imaging, the film may be removed from the receptor sheet to reveal the mask image on the receptor sheet.

Laser-Induced Film Transfer:

With this imaging mechanism, the exposed regions of the imageable layer are removed from the carrier sheet (and transparent layer disposed thereon) through laser-induced film transfer ("LIFT"). An intermediate layer containing a latent crosslinking agent is disposed between the carrier sheet and the imageable layer. The latent crosslinking agent reacts with the binder to form a high molecular weight network in the exposed regions to provide better control of melt flow phenomena, transfer of more cohesive material to the receptor sheet, and high quality edge sharpness of the mask image.

In one embodiment, the imageable layer includes a transferable colorant and an infrared absorbing dye (IR dye). In another embodiment, the imageable layer includes a transferable colorant, a polymeric binder as described above, a fluorocarbon additive, a cationic IR dye, and latent crosslinking agent as described above.

The mask image can comprise the non-exposed regions of the imageable layer remaining in the imaged film, but in other embodiments, the mask image comprises the exposed regions that are transferred to the receptor sheet.

Peel-Apart:

In this imaging mechanism, the exposed regions of the imageable layer are removed from the carrier sheet (and transparent layer disposed thereon) using a suitable receptor sheet based differential adhesion properties in the imageable layer. After imagewise exposure of the film, the receptor sheet is separated from the carrier sheet and either exposed or non-exposed regions remain in the film.

Dye Sublimation or Diffusion:

In yet another imaging technique, colorant from exposed regions of the imageable layer is removed through sublimation wherein the colorant is diffused or sublimed without simultaneous transfer of the binder. A mask image may be generated in the film without the need for a receptor sheet. In other embodiments, a receptor sheet is used to capture the sublimed colorant. The mask image then comprises the imageable layer remaining in the imaged film. In still other embodiments, the mask image comprises the colorant that is transferred to a receptor sheet.

Alkaline Development of Mask:

The exposed regions of the imageable layer can also be removed by conventional alkaline development when the imaged film is washed with a suitable alkaline developer while non-exposed regions remain on the carrier sheet.

The imageable layer is positive-working in this instance and can be composed of any of the known positive-working compositions. The developer has a pH of from about 9 to about 14 and comprises water and generally a hydroxide and other various addenda common to such solutions.

Alternatively, the non-exposed regions of the imageable layer are removed from the imaged film to produce a mask image. Such imageable layer compositions are negative-working and become insoluble in the developer upon exposure. Useful developers for such materials generally have a pH of from about 7 to about 13 and include water-miscible high-boiling organic solvents and various addenda common to such solutions.

Useful developers for these materials are well known and available from several sources including Eastman Kodak Company (Norwalk, Conn.).

Once the mask image has been formed, it is transferred to a suitable radiation-sensitive element (described above) that is sensitive to curing radiation (usually UV radiation). Mask image transfer includes placing the film with the mask image onto the radiation-sensitive element, or a radiation-sensitive composition or layer thereof.

The film and radiation-sensitive element are placed in such contact as to provide an air-free interface. Generally, this is achieved by laminating the film it to the radiation-sensitive element by applying pressure or heat, or both pressure and heat to form an air-free or gap-free interface.

In one preferred embodiment, the radiation sensitive element for flexographic applications does not have a separation layer (anti-tack layer), so pressure alone may be sufficient to achieve air-free interface, as the radiation sensitive element is conformable to allow optical contact due to wetting properties, which is in part due to the presence of monomers. The laminator described below works to achieve the air-free interface with the desired optical contact using pressure.

Exposure of Radiation-Sensitive Element:

After an air-free contact is made between the mask film and the radiation sensitive element as described above, the radiation-sensitive element is exposed to curing radiation through the film containing the mask image to form an imaged element. In this step, the curing radiation is projected onto the radiation-sensitive element through the mask image that preferentially blocks some of the radiation. In unmasked regions, curing radiation will cause hardening or curing of the radiation-sensitive composition(s). The mask image should therefore be substantially opaque to the exposing radiation, meaning that the mask image should have a transmission optical density of 2 or more and preferably 3 or more. The unmasked regions should be substantially transparent meaning that the unmasked regions of the radiation-sensitive element should have a transmission optical density of 0.5 or less, preferably 0.1 or less, and more preferably 0.05 or less. Transmission optical density can be measured using a suitable filter on a densitometer, for example, a MACBETH TR 927 densitometer.

Generally, exposure of the radiation-sensitive element through the film containing the mask image is accomplished by floodwise exposure from suitable irradiation sources (for example, visible radiation or UV radiation). Exposure can be carried out in the presence of atmospheric oxygen. Exposure under vacuum is not necessary as air-free contact (or optical contact) has already been made.

In the manufacture of a relief printing plate, such as a flexographic printing plate, one side of the radiation-sensitive element is generally first exposed to curing radiation through a transparent support (known as "back exposure") to prepare a thin, uniform cured layer on the support side of the element. The radiation-sensitive element is then exposed to curing radiation through the film containing the mask image, thereby causing the radiation-sensitive composition to harden or cure in the unmasked areas. Unexposed and uncured regions of the radiation-sensitive element are then removed by a developing process (described below), leaving the cured regions that define the relief printing surface. The back exposure could be performed either before or after the air-free contact is made between the mask film and the radiation sensitive element.

The wavelength or range of wavelengths suitable as the curing radiation will be dictated by the nature of the radiation-sensitive element. In some embodiments, the curing radiation is ultraviolet radiation at a wavelength of from about 340 to about 400 nm. Sources of visible or UV radiation for floodwise or overall exposure include but are not limited to, carbon arcs, mercury-vapor arcs, fluorescent lamps, electron flash units, and photographic flood lamps. UV radiation is particularly useful from mercury-vapor lamps and more particularly sun lamps. Representative UV radiation sources include SYLVANIA 350 BLACKLIGHT fluorescent lamp (FR 48T12/350 VL/VHO/180, 115 watts) that has a central emission wavelength of about 354 nm that is available from Topbulb (East Chicago, Ind.), and BURGESS EXPOSURE FRAME, Model 5K-3343VSII with ADDALUX 754-18017 lamp available from Burgess Industries, Inc. (Plymouth, Mass.).

Other suitable sources of UV radiation include platemakers that are able to both expose the radiation-sensitive element to radiation and to develop the element after radiation exposure. Examples of suitable platemakers include but are not limited to, KELLEIGH MODEL 310 PLATEMAKER available from Kelleigh Corporation (Trenton, N.J.) and the GPP500 F PLATE PROCESSOR available from Global Asia Ltd. (Hong Kong).

The time for exposure through the mask image will depend upon the nature and thickness of the radiation-sensitive element and the source of the radiation. For example, in one of embodiment, a FLEXCEL-SRH plate precursor available from Eastman Kodak Company (Norwalk, Conn.) may be mounted on a KELLEIGH MODEL 310 PLATEMAKER and back exposed to UV-A radiation through the support for about 20 seconds to prepare a thin, uniform cured layer on the support side of the element. The cover sheet of the radiation sensitive element is then removed from the front side, and the film containing the mask image is then brought into air-free contact with the radiation sensitive element on the front side. The assembly may then be exposed to a UV radiation through the film containing the mask image for about 14 minutes. The mask image information is thus transferred to the flexographic plate precursor.

Relief Image Development:

The carrier sheet including the mask, or the carrier sheet without the mask, is then removed, by any appropriate means, such as peeling. The carrier sheet could optionally be removed before the UV exposure, leaving the ask on the photosensitive layer. The exposed element (or imaged element) is then generally developed with a suitable developer to form a relief image. Development serves to remove the uncured regions of the radiation-sensitive element, leaving the cured regions that define the relief image on the substrate.

Development is usually carried out under conventional conditions such as for from about 5 to about 20 minutes and at from about 23 to about 32° C. The type of developing apparatus and specific developer that are used will dictate the specific development conditions.

Post-development processing of the relief image may be suitable under some circumstances. Typical post-development processing includes drying the relief image to remove any excess solvent ad post-curing by exposing the relief image to curing radiation to cause further hardening or crosslinking. The conditions for these processes are well known to those skilled in the art. For example, the relief image may be blotted or wiped dry, or dried in a forced air or infrared oven. Drying times and temperatures would be apparent to a skilled artisan. Post-curing may be carried out using the same type of radiation previously used to expose through the mask image. Development may also be possible by the thermal process as disclosed in U.S. Pat. Nos. 5,175,072 (Martens), 5,279,697 (Peterson et al.), and 6,998,218 (Markhart).

Figure 2:
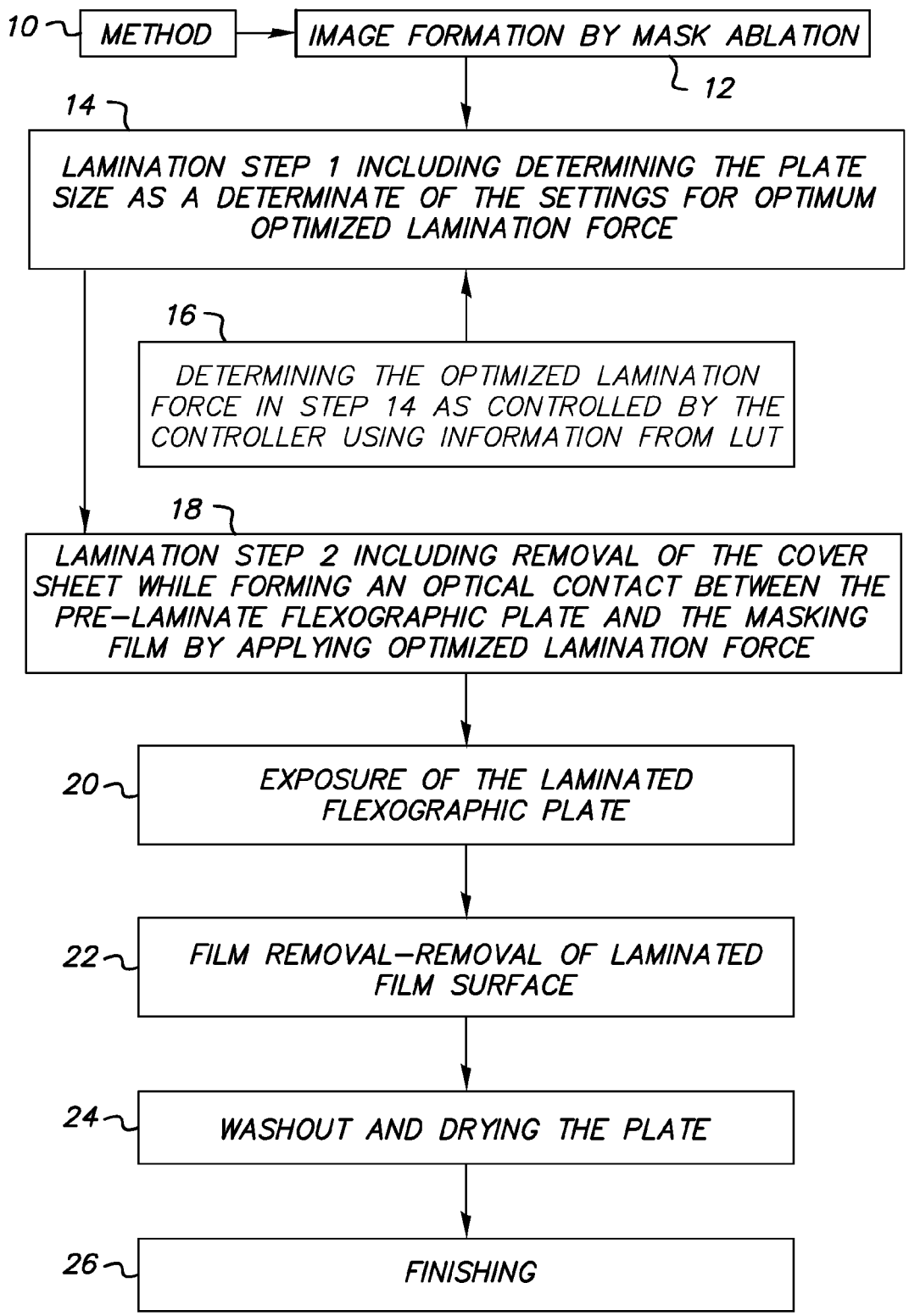
FIG. 2 is a flowchart of a method of the present invention that may be implemented for flexographic plates.

One method of making a flexography plate 10 is shown in FIG. 2 and includes making a relief image by forming a mask image with exposed and non-exposed regions in an imaged film 12. The imaged film is transferred by laminating the mask image in the imaged film to a radiation-sensitive element while there is complete optical contact between the mask image and the radiation-sensitive element, exposing the radiation-sensitive element to curing radiation through the optional carrier sheet and the mask image to form an imaged element, wherein the mask image is opaque to the curing radiation, and developing the imaged element to form a relief image.

The present invention provides a method of laminating and a method of using the laminator to provide imaged radiation-sensitive elements (such as flexographic printing plates) with improved relief images that predominantly have shoulder angles of at least 50° while holding desired small dot features in halftone areas and maintaining good reverse line depth. When the imaged film (masking film step 12) is used to form a relief image in a radiation-sensitive element, the imaged film is placed into intimate or complete optical contact (steps 14-18) with the element in such a manner as to eliminate any air, void space, or gap at the interface (thus, an "air-free" interface). Such a gap may be under vacuum so that air is lacking, but such a gap under vacuum also would not be considered an "air-free" interface before being exposed (step 20), having the film removed (step 22) and washing, drying, and finishing (steps 24, 26).

The method for laminating a masking film onto a pre-press flexographic printing plate to place the plate in optical contact with the film mask by applying a balanced, non-distorting force to the flexographic printing plate and masking film as shown in steps 14, and 18 including controlling the force as necessary based on known plate information, such as plate size, weight, softness, thickness, roller shape and other factors that effect the uniform force applied during lamination. The mask image is then transferred from the imaged film by laminating it by applying pressure to a FLEXEL flexographic printing plate precursor available from Eastman Kodak Company (Rochester, N.Y.), so that the interface between the imaged film and precursor is air-free, that is, optical contact is achieved. The martial to material contact needed must be the optical contact discussed above. This is especially important with flexographic plates since the material used is viscoelastic, like a rubber band, that is it is conformable under pressure and temperature but may then return to its previous share easily causing distortions discussed above. It is also hard to start to move which adds to difficulties in lamination systems especially when accuracies to within +/−1 mil are critical.

Figure 3:
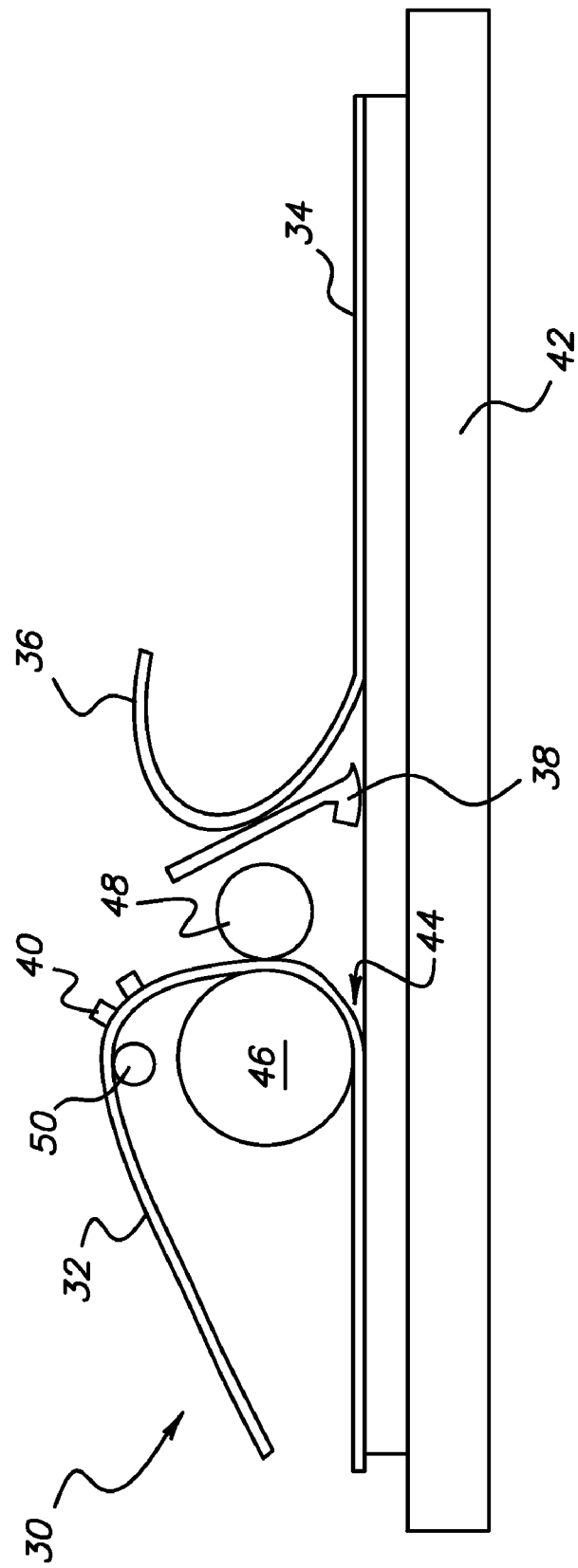
FIG. 3 is a schematic drawing of a laminating device of the present invention that may be implemented for flexographic plates.

FIG. 3 shows a flexographic laminating device 30 for laminating a masking film, also referred to as a film layer, 32 onto a photopolymer, also referred to as a pre-press flexographic printing plate, 34 while removing a protective cover sheet 36 using a plow 38, as shown. During the preparation of the flexographic plate 7 using the film layer 32 with the relief image or mask 40 on one side, as shown in FIG. 3 a vacuum table 42 is used to hold the pre-press flexographic printing plate 34 in place. The laminating device 30 includes at least one nip 44 between a lamination roller 46 and the vacuum table 42 as well as another between the lamination roller 46 and a pressure or nip roller 48 aided by a loading guide 50. The nip 44 supplies constant force to assure that the mask is always in contact with the plate during lamination.

It is important that lamination only occurs at the nip 44 and this is achieved in the present invention by balancing the forces through the use of an independently gimbaled lamination roller that allows flexure as needed but limits lateral forces on the plate, especially at the nip across the lamination roller which is separate and independent to the gantry's movement during lamination back and forth. This is done in conjunction with removal of the cover sheet so that the sheet is removed right before the lamination roller contacts the film by first lifting the very first part of the front edge of the cover sheet and placing it on the plow. Note that the protective cover sheet 36 is removed while and just before the mask 40 is laminated. This keeps the flexographic plate covered except for the area that lamination is occurring.

In addition, the nip roller 46 acts as a cleaning roller in that the relief image on the film mask 40 faces the nip roller 48. An elastomeric coating capable of removing dirt is used on the surface of the nip roller 48 to pick up any lint and dust debris from the surface of the film layer 32, with a mask 40, before it is laminated to the flexographic plate 34. The distance between removing the protective cover sheet 36 and laminating the mask is small and may even be enclosed or with a positive air pressure to eliminate any air borne contaminants.

In one embodiment the vacuum table helps the plow work to remove the cover after the covered pre-laminate flexographic plate is loaded into the laminator. The pre-laminate flexographic printing plate includes the cover sheet and in some embodiments can be manually and/or automatically aligned with the nip between the laminating roller and the table. In one preferred embodiment the laminating roller includes a steel core coated with a polyurethane coated lamination roller. A bare metal roller could cause defects because it would not conform to any imperfections in the table and an aluminum roller did not work as well but could be used in certain circumstances where the errors were not induced, such a flat table or not significant to the observer.

Figure 4:
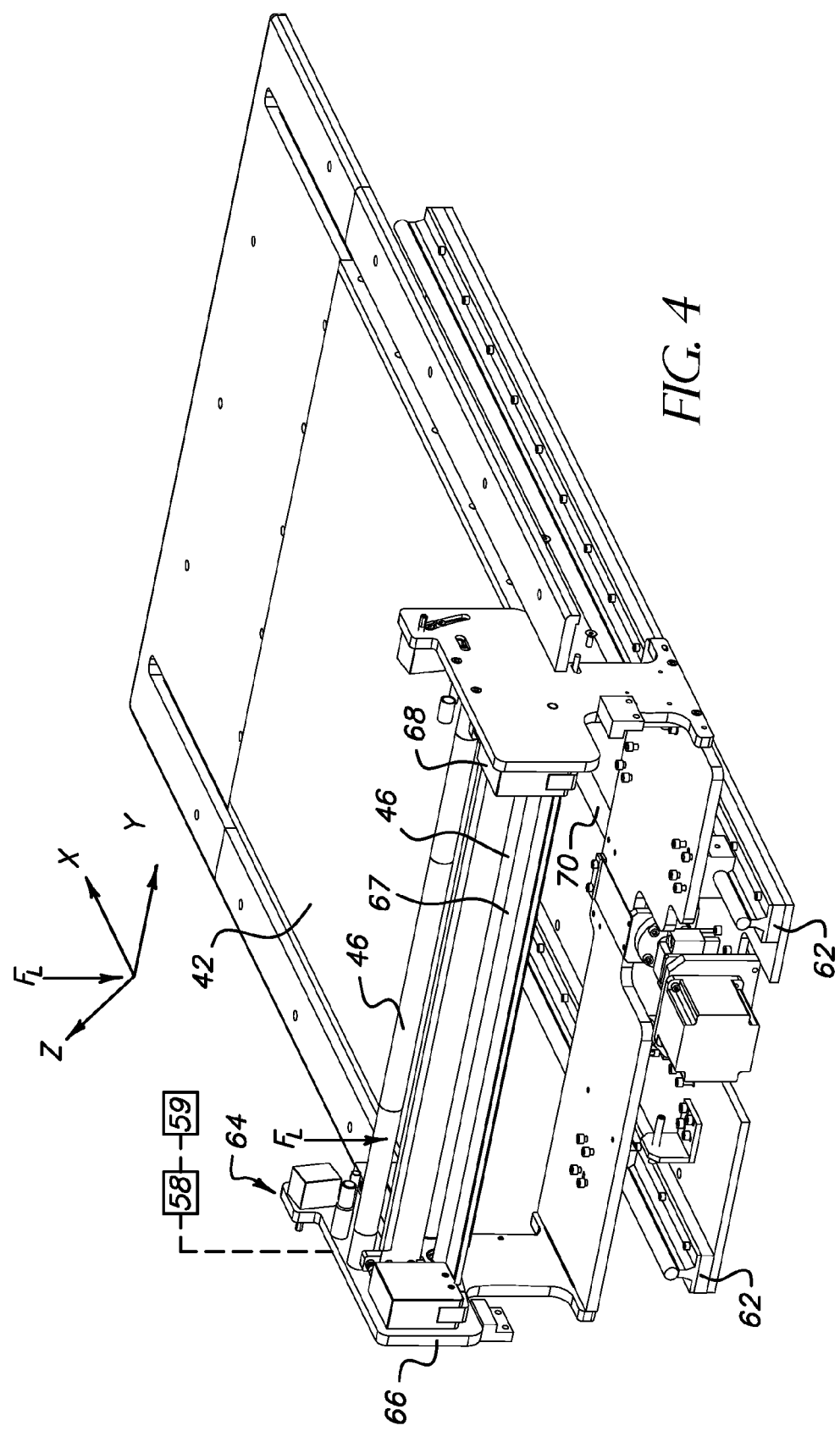
FIG. 4 shows a perspective drawing of a laminating device of the present invention that may be implemented for flexographic plates.

The flexographic laminating device 30 is supported by the lamination gantry 56, as shown in FIG. 4, to apply a film 32 to the flexographic plate 34. FIG. 4 shows an optional controller 58 and one or more sensors 59 that can put the laminating device in an operational mode or a sleep mode as well as control the force applied ($F_L$) 60 including a force in the x ($F_x$), y ($F_y$) and z ($F_z$) directions as discussed below. A vacuum is applied through openings in the table, as discussed below during the operational mode which also includes placing the film proximate the flexographic plate 34 just before it is ready to be to laminated. This can be automated to manually controlled.

The controller 56 uses input from manufacturing information including one or more of a sensor, timer, electrical information and process chemical information. The controller 56 is also capable of communicating with the web through the one or more sensors 59 as well as various other controllers and sensors that control other steps of the manufacturing process. This allows the coating process to be stopped as needed to allow cleaning of the applicator without stopping other processes and thus resulting in an automated process.

Photopolymer type of coating tends to be tacky which predisposes this manufacturing process to undesired residues on the final product. As a result of the tackiness it is common for the coating to acquire a deposition of material or residue on the surface that comes into contact with photopolymers. This could result in defects that are unacceptable and possible manufacturing stoppages that lead to inefficiencies and/or defective final products. These defects may not be observable until the plates are imaged weeks or months later at locations far removed from the manufacturing location. Ensuring production of plates without defects is essential and the present invention assures that outcome.

The gantry 56, including two rails 62, acts as a support for the independently gimbaled lamination roller attached to a carriage 64, as shown in FIG. 4 which does not show some parts of the laminating device, including one or more lamination flexure plates, in order to clearly show other elements, such as the rollers. Note that the lamination flexure plates are clearly shown in FIG. 5. The carriage has sides 66. The sides support one or more weights 68 on each side that supply a force ($F_L$) that can be varied by plate size and width or other factors that could effect the application of a uniform force ($F_L$) on during lamination and thus effect the formation of an optical contact since an optical contact requires uniform force applied across the length of the plate and film during lamination.

The gantry is designed to support the lamination roller in such a way that it essentially "floats" across the plate during lamination so that the lamination roller supplies a force in only one direction (toward the plate) and is independently supported to do so without placing undue lateral forces on the highly sensitive plate and film during lamination and that conforms to changes in the surface of the table and/or the plate and film. Currently used tables have surfaces of durometer readings from 50-75 shore A and a preferred lamination roller has a polyurethane coating to take care of any bowing in a table's surface or even a crown roller shape since this exact laminating process essentially embosses and thus enough force must be applied to force the embossed film against the plate. Note that this film may be removed from the plate later and used alone or in conjunction with the plate. The martial to material contact needed must be the optical contact discussed above.

Figure 5:
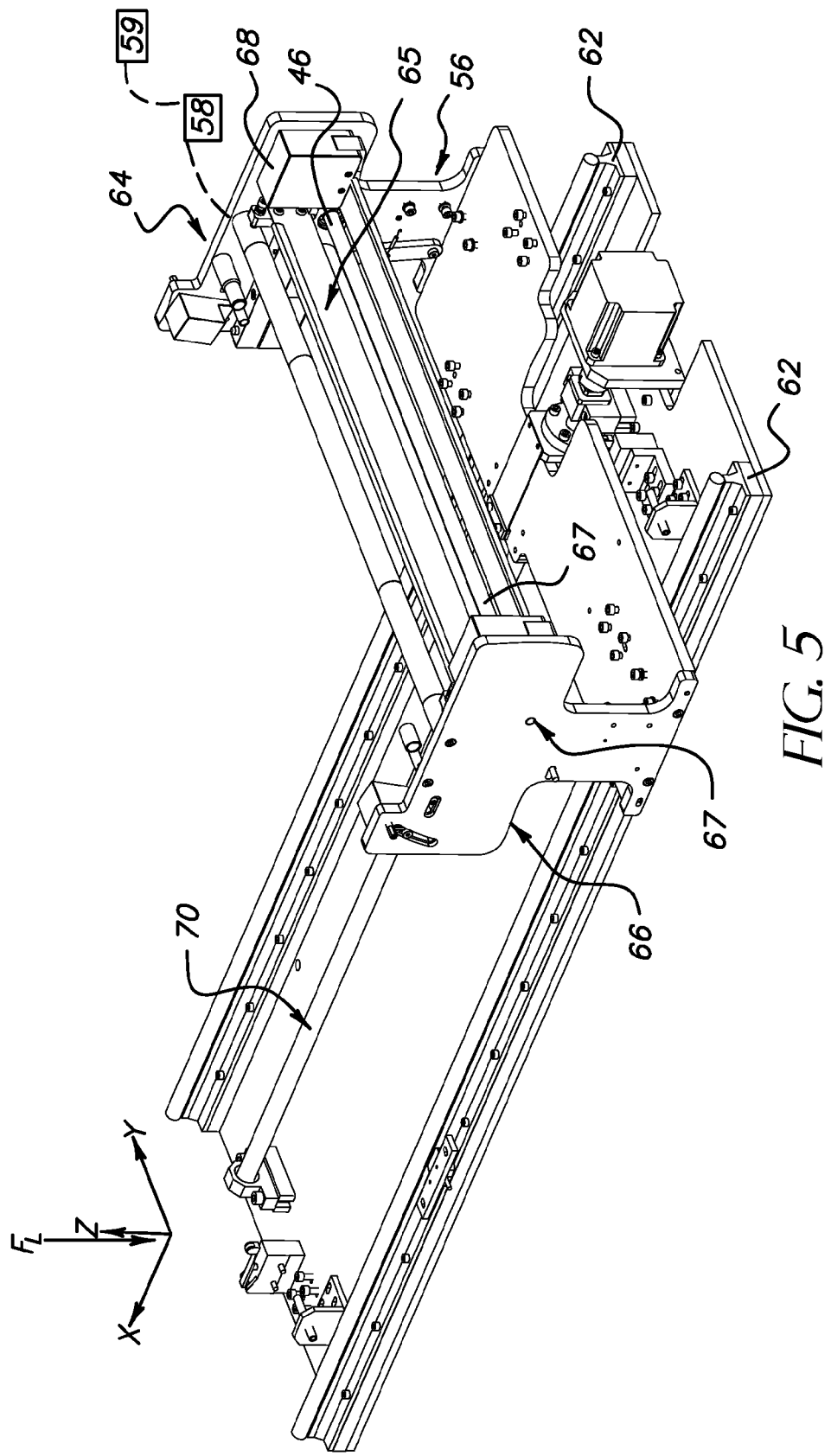
FIG. 5 shows a top perspective view of a portion of the lamination device that may be implemented for flexographic plates.
Figure 6:
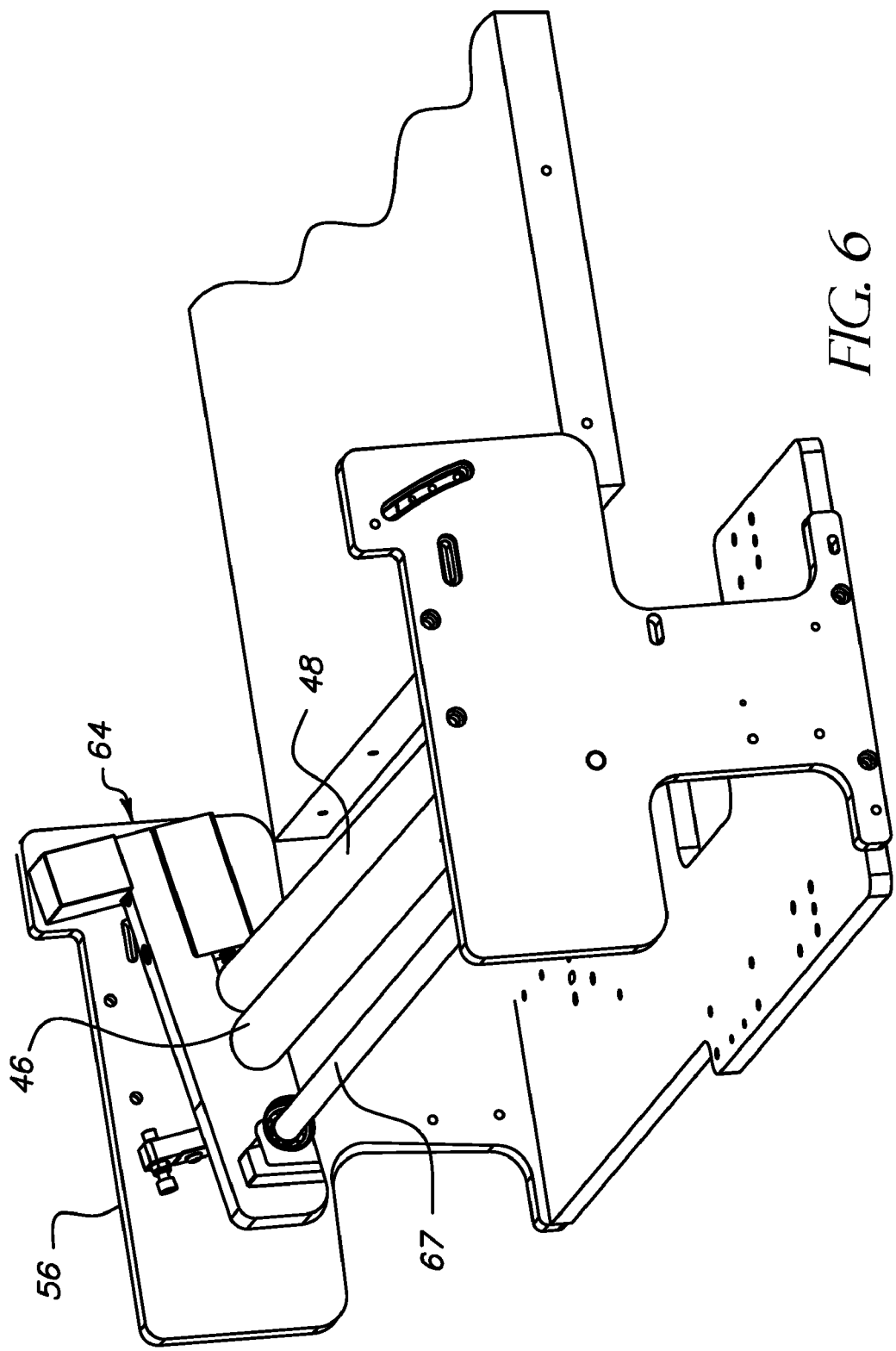
FIG. 6 shows a top perspective view of a portion of the lamination device that may be implemented for flexographic plates.
Figure 7:
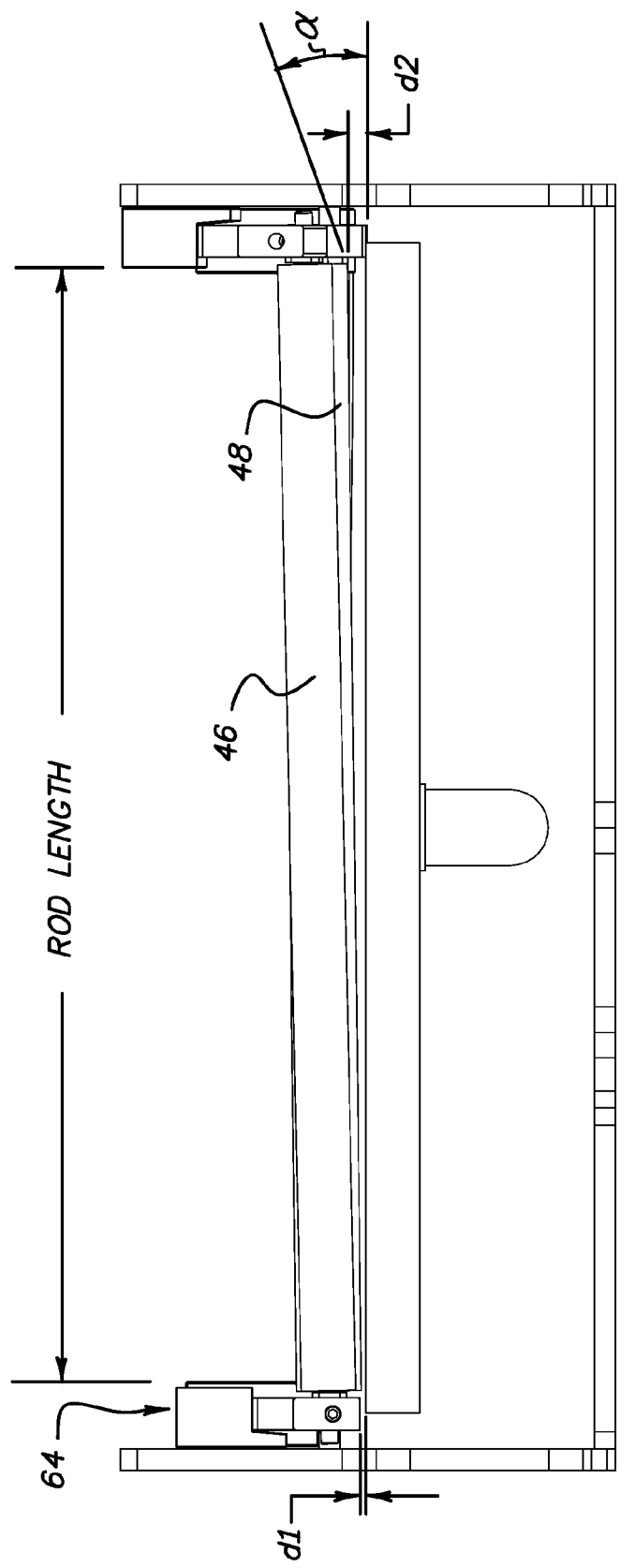
FIG. 7 shows a front view of a portion of the lamination device that may be implemented for flexographic plates.

FIGS. 5 and 6 show a top perspective views of a portion of the lamination device 30. The lamination roller 46 is attached to the carriage 64 in such a way that the lamination roller and carriage can float relative to the gantry 56 including the vacuum table 42 (removed from FIGS. 5 and 6 but shown in FIG. 4). Two lamination flexure plates 65 and a pivot rod 67 are attached to the carriage 64 so that the lamination roller 46 pivots around pivot bar 67, that connects the carriage 64, in such a way that the lamination only moves in one direction relative to the plate 34 during lamination and does not apply lateral stresses on the plate resulting in defects and distortions. FIGS. 6 and 7 clearly show this movement as a twisting from one side to another where the two rollers can pivot relative to the gantry and to each other.

Figure 8:
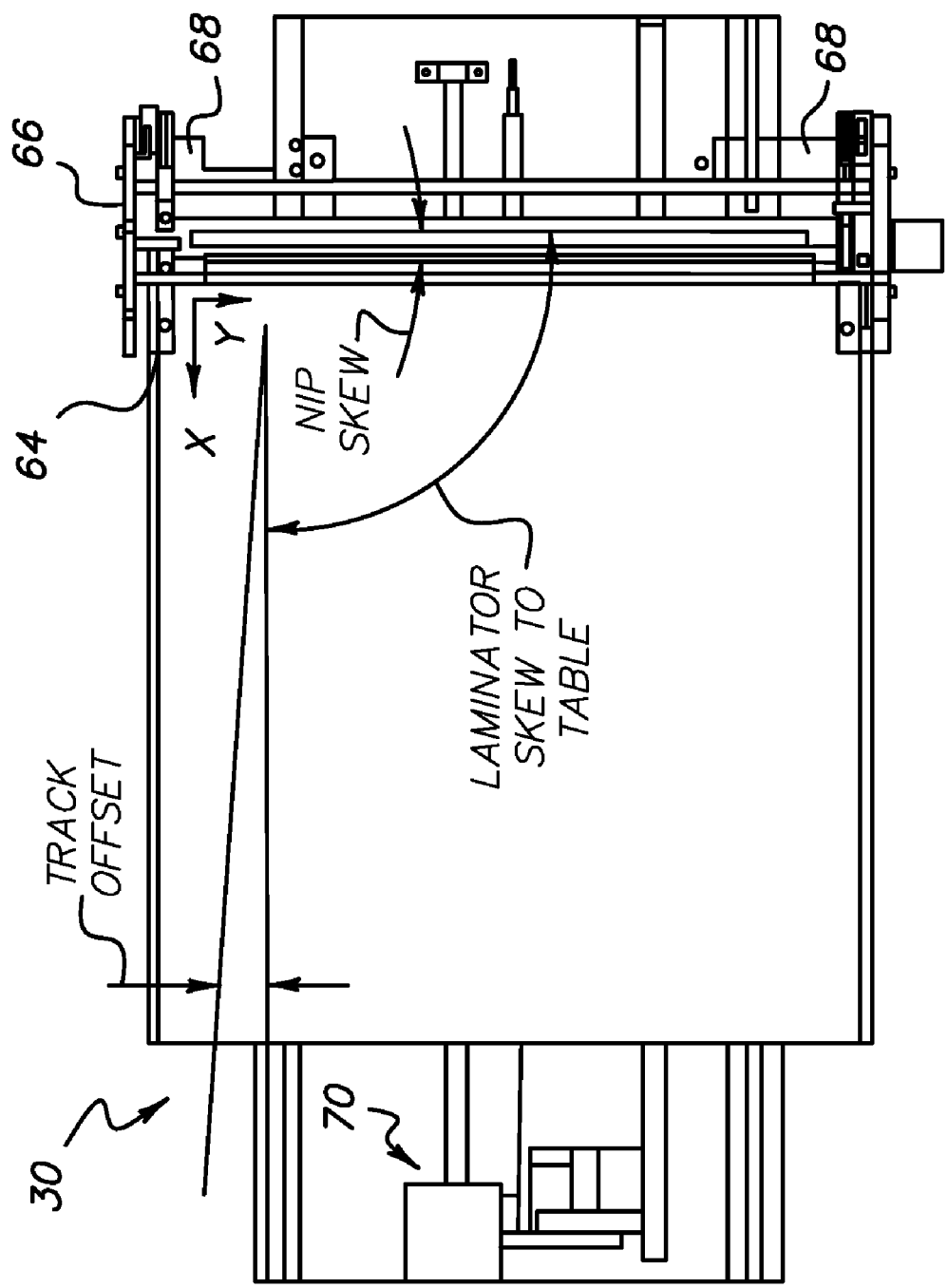
FIG. 8 shows a top view of a portion of the lamination device that may be implemented for flexographic plates.

The lamination flexure plates 65 effectively stabilize the lamination roller 46 so that it pivots or moves in only one plane as moved up and down. The flexure plates 65, also referred to as the lamination flexure device, allows the independently gimbaled lamination roller to move in a manner that minimizes lateral forces applied at the lamination roller nip 44. Additionally the lamination flexure plates 65, add a dampening to the lamination roller, as it is moved through the lamination cycle thus minimizing other lateral, non optimal force in undesirable directions including skew as shown in FIG. 8. This allows the lamination device, in conjunction to the screw flexure plates described below, to operate much more efficiently, saving up to 40% on energy as well as helping dampen out oscillations and allow the laminator to create an optical contact between the film and the plate during lamination.

Figure 9:
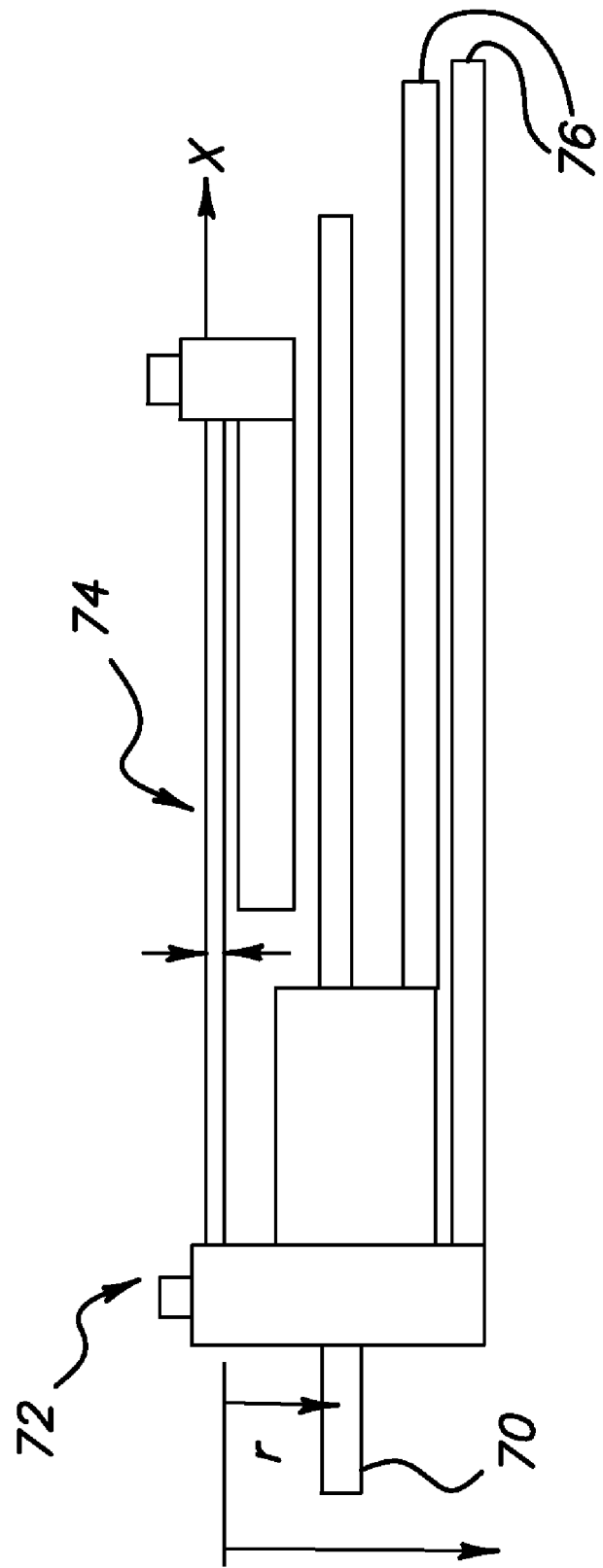
FIG. 9 is a schematic drawing showing a part of the laminating device including a support gantry of the present invention that may be implemented for flexographic plates.

A single center screw 70 is centrally located under the flat vacuum table 42. The center screw 70 has a flexure device 72, as show in FIG. 9, attached to the screw in one embodiment. The gantry flexure device shown has 3 flat blade flexure plates, one flat blade flexure plates 74 above the screw and two flat blade flexure plates 76 on either side of the screw. The flexure device allows the independently gimbaled movement that minimizes lateral forces applied at the lamination roller nip 44 and additionally adds a dampening to the screw and thus the lamination roller, as it is moved through the lamination cycle thus adding control, when coupled with the lamination flexure plates, in the other lateral, non optimal force, directions. The screw 70 moves the laminating device rollers on the gantry, including the two side rails so that the pre-laminated sheet is exposed to a uniform lamination force in the x and y directions and maximized balanced force in the z direction to minimize distortion awhile eliminating bubbles and also keeps distortion to less then 0.02% of a length. It is the combination of the control of skew and the lamination flexure plates that allow minimization of lateral forces.

In one embodiment, adjustable size-dependent weights 68 are placed on each side 66 of the carriage to support two or more sizes of pre-press film. Note that a spring or other pressure dependent force maybe less desirable because the force varies with pressure and may cause great variations in the force applied to the lamination film during lamination. The weights 68 correct the problem of "constant gap" and are adjusted for each plate size. This allows for better control of the optimum lamination force ($F_L$) on the variable sized flexographic plates, each having a optimized lamination force that is controllable by a controller having a look-up table (LUT) that contains one or more of: size-dependent weight to realize the sufficient laminating force ($F_L$) necessary based on plate size, weight, softness (durometer reading), thickness, roller shape and other factors that effect the uniform force applied during lamination to achieve optical contact.

Figure 10:
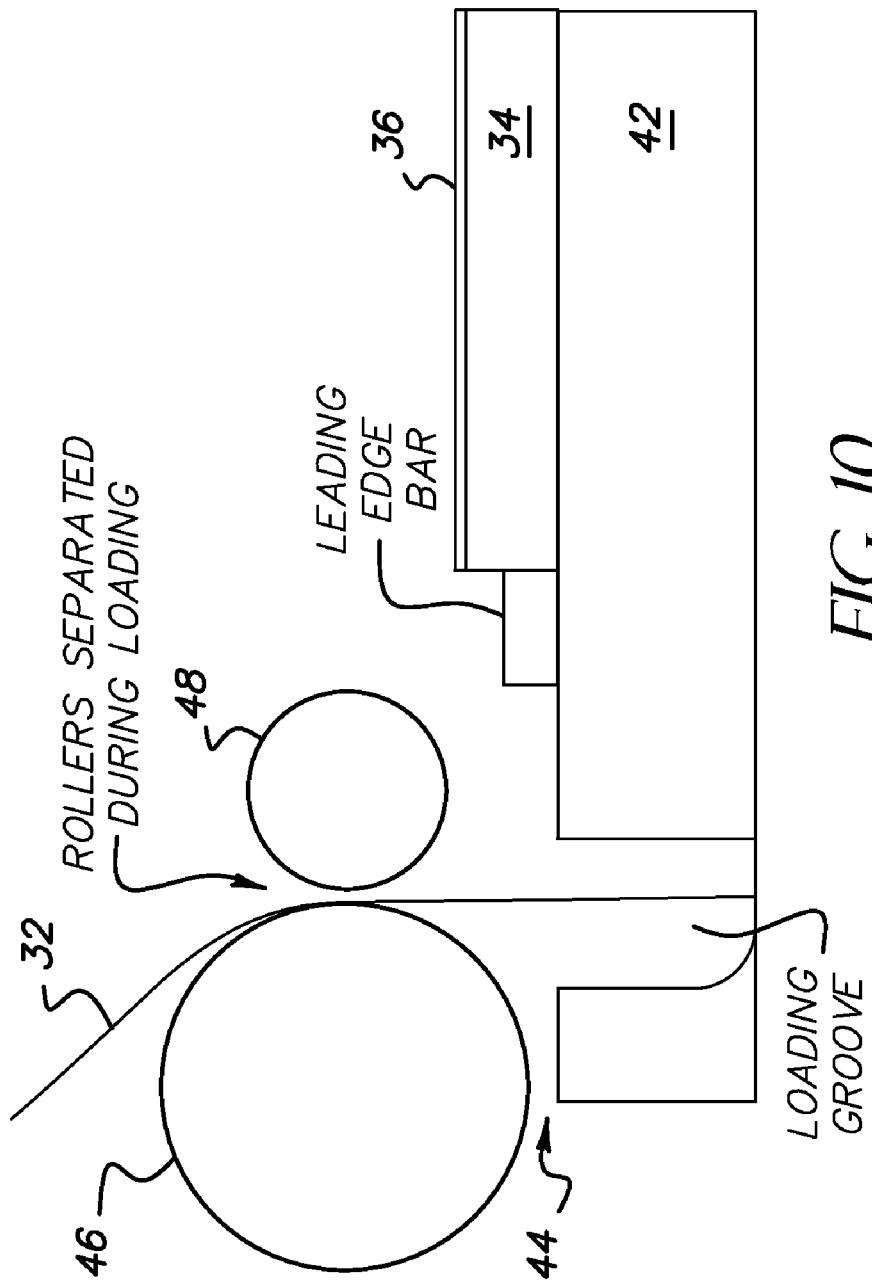
FIG. 10 a schematic drawing showing a part of the laminating device during loading that may be implemented for flexographic plates.
Figure 11:
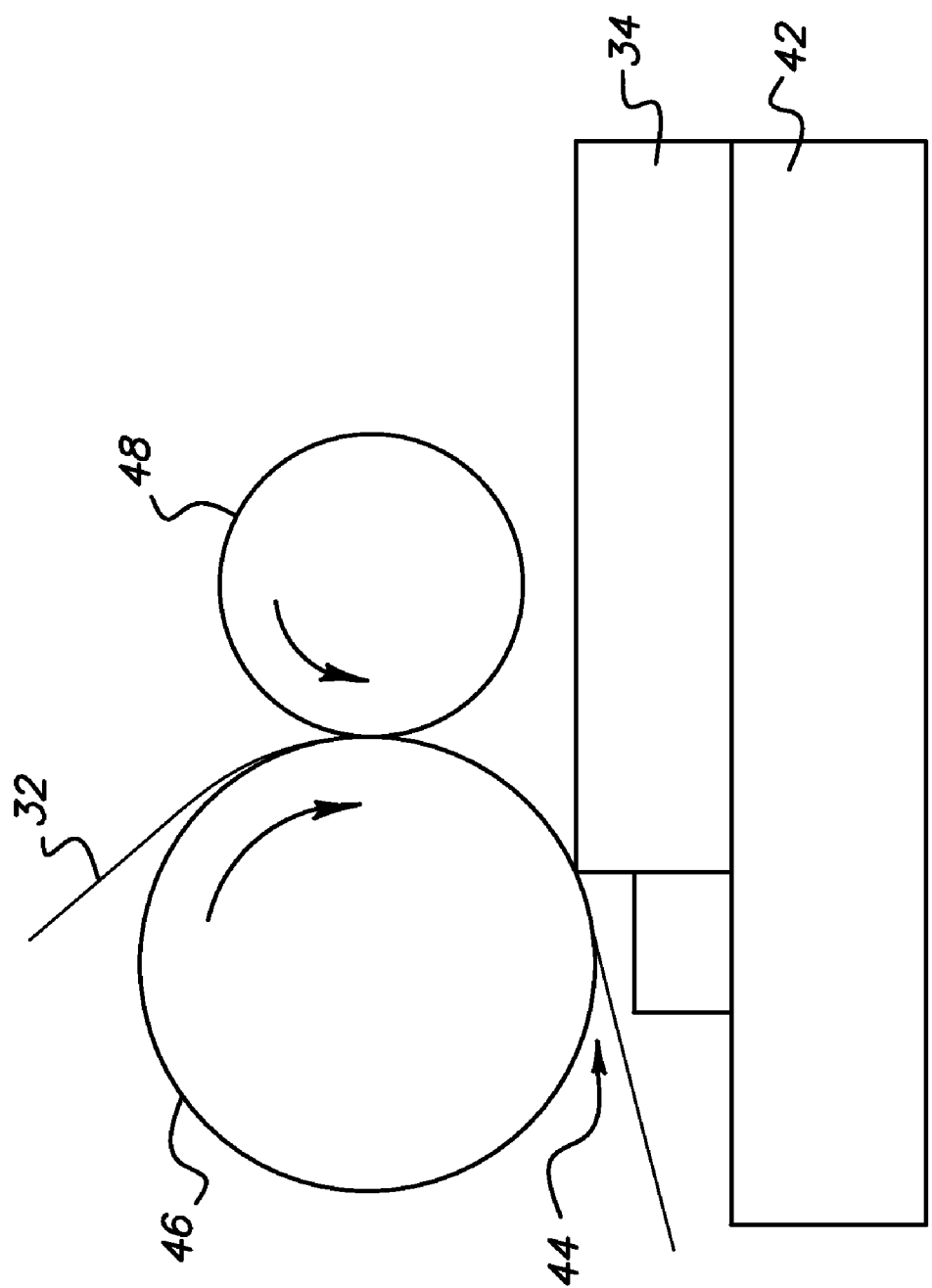
FIG. 11 a schematic drawing showing a part of the laminating device during loading that may be implemented for flexographic plates.

FIG. 10 shows the lamination device during loading of a film, which is critical, to prevent wrinkles in the final laminated plate. The mask must be first wound around the lower portion of the lamination roller as shown in FIG. 11 so that the mask comes in contact with the roller before it contacts the plate. The film 32 is placed between the two rollers (46, 48) and into a loading groove. Then the two rollers clasp the film before the plate is moved toward the lamination roller, contacting the film and helping it wrap around the lamination roller as the roller is moved in a clockwise direction with the aid of a clutch that prevents backward rotation.

Figure 12:
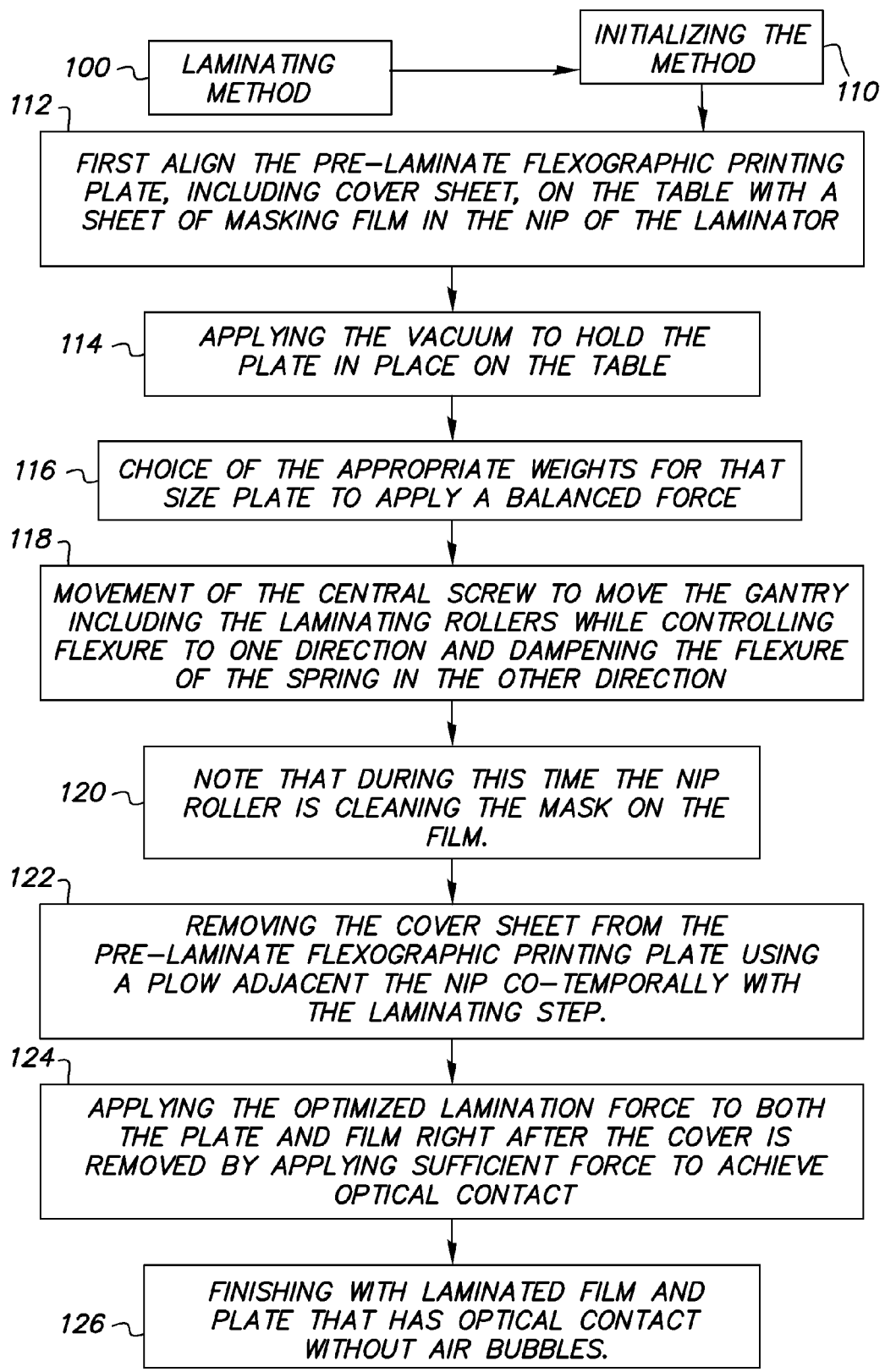
FIG. 12 is a flowchart of a laminating method of the present invention that may be implemented.

FIG. 12 is a flow chart of a laminating method 100 for the laminating device 30 that places the pre-press flexographic printing plate in optical contact with the film mask by first aligning a pre-laminate flexographic printing plate with a sheet of masking film. The pre-laminate flexographic printing plate includes the flexographic printing plate and a cover sheet aligned in the nip 44 such that the lamination roller is supported by the independently gimbaled (6 degrees of freedom) support gantry wherein only the lamination roller contacts a support table, then removing the cover sheet from the pre-laminate flexographic printing plate using a plow adjacent the nip co-temporally with the laminating step below and applying an optimized lamination force in the z direction by applying sufficient force in the direction of the lamination roller direction (FL) to achieve optical contact while minimizing film lateral distortion in the x (Fx) and y (Fy) directions by applying the balanced, non-distorting force to the flexographic printing plate and masking film comprising alignment correction including using the independently gimbaled (6 degrees of freedom) nip support gantry and counterbalance before actually laminating the film mask to the flexographic printing plate by applying the balanced force to the pre-laminated sheet while removing the cover sheet with the plow to form a pre-press laminated flexographic plate that is flat.

The first step is to initialize the system 110 before aligning the pre-laminate flexographic printing plate, including cover sheet, on the table with a sheet of masking film in the nip of the laminator 112. Then the vacuum is applied 114 to hold the plate in place on the table and the appropriate choice of weights 116 for that size plate is positioned at the sides of the gantry to help apply a balanced force.

The next step 118 involves moving of the central screw to move the gantry including the laminating rollers while controlling flexure in one direction and dampening the flexure of the spring in the other direction. Note that during this time the nip roller is cleaning the mask on the film 120. The cover sheet is removed 122 from the pre-laminate flexographic printing plate using a plow adjacent the nip by placing the front edge of the cover sheet on the plow before laminating occurs. This is done co-temporally with the laminating step in order to minimize the amount of plate is exposed before lamination. prior to applying 124 the optimized lamination force to both the plate and film right after the cover is removed by applying sufficient force to achieve optical contact. Finally the laminated film is finished 126 when the plate that has optical contact with the plate without air bubbles.

The invention has been described in detail with particular reference to certain preferred embodiments thereof, but it will be understood that variations and modifications can be effected within the spirit and scope of the invention.

The invention claimed is:

1. A pre-press flexographic plate laminator for laminating a masking film onto a pre-press flexographic printing plate, the apparatus comprising:
   a support gantry independently supporting a carriage, including one or more lamination flexure plates, to minimize lateral distortion to a flexographic printing plate and masking film during lamination;
   a lamination roller attached to the carriage, independently supported by the gantry, forming a nip with a vacuum table to apply a balanced, non-distorting optimized lamination force ($F_L$) to the flexographic printing plate and the masking film to achieve optical contact between the flexographic printing plate and the masking film; and
   a plow adjacent the nip to remove a cover sheet from the pre-laminate flexographic printing plate while applying the masking film;
   a center screw attached to the gantry to move the lamination roller along two side rails exposing the pre-laminated sheet to a uniform lamination force.

2. The apparatus of claim 1, wherein the lamination roller is polyurethane coated.

3. The apparatus of claim 1, wherein the carriage further comprises a self-alignment correction applied to the independently supported lamination roller.

4. The apparatus of claim 3, wherein the self-alignment correction further comprises adjustable plate-dependent weights on each side of the carriage.

5. The apparatus of claim 3, wherein the self-alignment correction further comprises one or more stabilizing flat blade flexure plates to minimize lateral distortions while forming an optical contact, wherein the one or more stabilizing flat blade flexure plates further comprise one plate above the screw and two below the screw on either side.

6. The apparatus of claim 5, wherein the nip roller acts as a cleaning roller in that the relief image on the film mask faces the nip roller during lamination.

7. The apparatus of claim 1, wherein the one or more stabilizing lamination flexure devices further dampen the lamination roller when the gantry is moved by the center screw.

8. The apparatus of claim 1, further comprising a controller to maximize the optimized lamination force ($F_L$) to achieve optical contact while minimizing film distortion by applying a balanced, non-distorting force to the flexographic printing plate and masking film by automatically loading and aligning the flexographic printing plate and masking film in the nip.

9. The apparatus of claim 8, wherein the controller further comprises a LUT that containing a correction for one or more of the following: plate size, weight, softness (durometer reading), thickness, roller shape and other factors that effect the uniform force applied to achieve optical contact between the film and the plate.

10. The apparatus of claim 8, wherein the controller is responsive to at least one of a time period or a sensor reading balanced, non-distorting optimized lamination force ($F_L$).

11. A pre-press flexographic plate laminator for laminating a masking film onto a pre-press flexographic printing plate, the apparatus comprising:
    a support carriage to minimize lateral distortion to a flexographic printing plate and masking film during lamination, the carriage including adjustable plate-dependent weights attached on each side of the carriage;
    a lamination roller independently supported by the carriage, the lamination roller forming a nip with a vacuum table, the lamination roller to apply a balanced, non-distorting optimized lamination force ($F_L$) to the flexographic printing plate and the masking film to achieve optical contact between the flexographic printing plate and the masking film during lamination; and
    a plow adjacent the nip to remove the cover sheet from the pre-laminate flexographic printing plate while applying the masking film.

* * * * *